United States Patent [19]

Wieder et al.

[11] Patent Number: 4,468,851
[45] Date of Patent: Sep. 4, 1984

[54] PROCESS FOR MAKING A HETEROJUNCTION SOURCE-DRAIN INSULATED GATE FIELD-EFFECT TRANSISTORS UTILIZING DIFFUSION TO FORM THE LATTICE

[75] Inventors: Herman H. Wieder; Arthur R. Clawson, both of San Diego, Calif.

[73] Assignee: The United States of America as represented by the Secretary of the Navy, Washington, D.C.

[21] Appl. No.: 330,281

[22] Filed: Dec. 14, 1981

[51] Int. Cl.³ .................... H01L 21/223; H01L 21/20
[52] U.S. Cl. ............................ 29/571; 29/576 E; 29/578; 29/580; 29/591; 148/175; 148/187; 156/648; 357/22; 357/23; 357/16
[58] Field of Search ............ 29/571, 576 E, 578, 29/580, 591; 148/175, 187; 156/648, 655, 662; 357/22 P, 23 NS, 16, 61

[56] References Cited

U.S. PATENT DOCUMENTS

| | | | |
|---|---|---|---|
| 3,351,828 | 11/1967 | Beale et al. | 357/16 |
| 3,982,261 | 9/1976 | Antypas | 148/175 X |
| 4,075,651 | 2/1978 | James | 357/61 X |
| 4,160,261 | 7/1979 | Casey et al. | 357/23 NS |
| 4,186,407 | 1/1980 | Delagebeaudeuf | 357/13 |
| 4,350,993 | 9/1982 | Wieder | 357/22 X |

OTHER PUBLICATIONS

Wieder et al., "Inversion-Mode Insulated Gate $Ga_{0.47}In_{0.53}As-$", IEEE Electron Device Letters, vol. EDL-2, No. 3, 1981, pp. 73–74.
Leheny et al., "Am $In_{0.53}Ga_{0.47}As$ Junction Field-Effect Transistors", IEEE Electron Device Letters, vol. EDL-1, No. 6, Jun. 1980, pp. 110–111.
Terman, L. M., "MOSFET Structures Using Selective Epitaxial Growth", IBM Tech. Discl. Bull., vol. 13, No. 11, Apr. 1971, pp. 3279–3280.
Fukuta et al., "Power GaAs MESFET–", IEEE Trans. on Microwave Theory & Tech., vol. MTT-24, NO. 6, Jun. 1976, pp. 312–317.

Primary Examiner—William. G. Saba
Attorney, Agent, or Firm—Robert F. Beers; Ervin F. Johnston; Thomas Glenn Keough

[57] ABSTRACT

An apparatus for and a method of making heterojunction source-drain insulated gate field-effect transistors in order to obtain higher gain-bandwidth products at microwave frequencies. A semi-insulating InP semiconductor substrate is provided with a ternary alloy layer of p-type $Ga_{0.47}In_{0.53}As$, or optionally, an acceptor-doped p-type bulk of $Ga_{0.47}In_{0.53}As$ can be substituted. Troughs are shaped in the substrate and layer for receiving a material lattice-matched to the n+ p-type $Ga_{0.47}In_{0.53}As$ to perform as the source and drain contacts, n+ doped InP might be a suitable material. An optional method for forming the contacts calls for directing a stream of phosphine and hydrogen onto source and drain contact windows contacting the $Ga_{0.47}In_{0.53}As$ which is heated to 750° C. for about 15 minutes. This creates graded heterojunction source and drain contacts having a lattice-matching variable composition.

3 Claims, 1 Drawing Figure

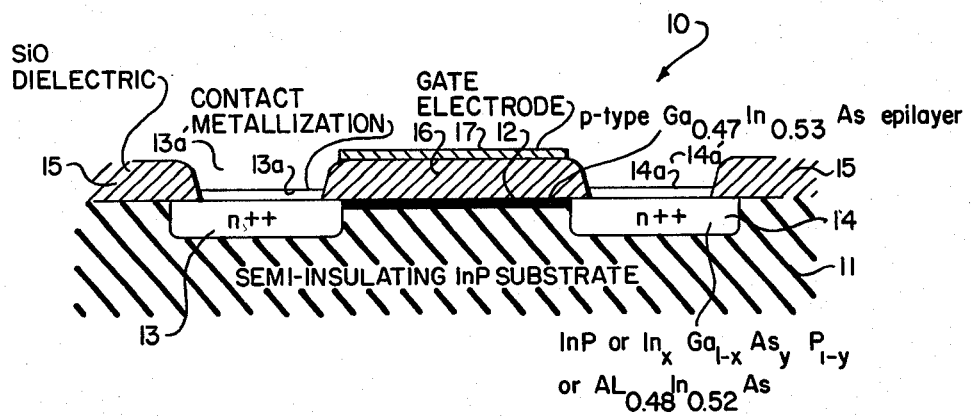

PROCESS FOR MAKING A HETEROJUNCTION SOURCE-DRAIN INSULATED GATE FIELD-EFFECT TRANSISTORS UTILIZING DIFFUSION TO FORM THE LATTICE

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATIONS

This application is related to an application filed Dec. 14, 1981 in the U.S. Patent and Trademark Office, Ser. No. 330,283, by Herman H. Wieder entitled "Inversion-Mode Insulated Gate $Ga_{0.47}In_{0.53}As$ Field-Effect Transistor".

BACKGROUND OF THE INVENTION

This invention relates to the field of FETs having improved higher frequencies and larger gain-bandwidth capabilities. More particularly inversion mode operation between heterojunction contacts through a p-type ternary alloy epilayer permits faster electron transit.

The only inversion mode field-effect transistors, other than silicon devices, are those employing indium phosphide or such as described by H. H. Wieder et al in IEEE Electron Device Letters, Vol. EDL-2, page 73 (1981) which are the basis of this invention.

The above cited related invention of H. H. Wieder represents still another advance in the state-of-the-art for improving the capability of the field-effect transistor. It discloses the use of p-type $Ga_{0.47}In_{0.53}As$ in an epilayer under an insulated gate electrode and touching the source and drain contacts to help assure improved operational capabilities.

Although U.S. Pat. No. 3,982,261 to George A. Antypas discloses a quarternary alloy layer lattice-matched to an InP substrate, his application has been used for improving the responses of photocathodes and lasers. The energy bandgap differences are utilized to enhance the infrared sensitivity and to provide means for varying the operating wavelengths of a solid state laser. Antypas does not appreciate the favorable properties of the disclosed materials for use in a heterojunction field-effect transistor.

The disclosure of the U.S. Pat. No. 4,186,407 concerns the use of $Ga_{0.47}In_{0.53}As$ to fabricate avalanche diodes intended to function as oscillators. The purpose and intent of this patent also is distinct from that of using heterojunction source and drain contacts and an insulated gate electrode for assuring improved operational characteristics of a field-effect transistor.

Thus, there is a continuing need in the state-of-the-art for a heterojunction source-drain insulated gate field-effect transistor in which lattice-matching materials are advantageously employed for the source and drain contacts to assure improved operational capabilities.

SUMMARY OF THE INVENTION

The present invention is directed to providing a method of making an inversion mode metal-insulator-semiconductor field-effect transistor having heterojunction source and drain contact junctions. First, there is the providing of a semi-insulating semiconductor substrate and a growing of a ternary alloy layer of p-type $Ga_{0.47}In_{0.53}As$ epitaxially on a portion of the semi-insulating semiconductor substrate. Next, there is the coating of the exposed semi-insulating semiconductor substrate and the ternary alloy layer with a dielectric. Opening source and drain contact windows through the dielectric coating that are in contact with the ternary alloy layer permits the depositing of a material lattice-matched to the p-type ternary alloy layer through the source and drain contact windows to form the heterojunction source and drain contacts. Superposing a metal gate electrode on a dielectric layer covering the ternary alloy layer in a region lying between the heterojunction source and drain contacts allows potential variations to produce an inversion mode control of the electron flow between the heterojunction source and drain contacts.

The prime object of the invention is to provide an improved method of fabricating a field-effect transistor.

Still another object is to provide a method for fabricating a heterojunction field-effect transistor.

Still another object is to provide a method for fabricating a heterojunction field-effect transistor employing an epitaxial grown p-type $Ga_{0.47}In_{0.53}As$ layer on a semi-insulating semiconductor substrate.

A further object is to provide a field-effect transistor having negligibly small currents due to the inclusion of heterojunction source and drain contacts.

Another object of the invention is to provide a method for fabricating a heterojunction field-effect transistor having the possibility for optical excitation of either heterojunction and optically-induced modulation coupled to the transistor action of the inversion-mode metal-insulator-semiconductor field-effect transistors.

Another object is to provide a method of making a heterojunction field-effect transistor having the capability for high frequency and microwave response due to the high transconductance and the prevention of minority carrier injection into the larger bandgap InP by the holes in the $Ga_{0.47}In_{0.53}As$ epilayer.

These and other objects of the invention will become more readily apparent from the ensuing description and claims when taken with the appended drawings.

BRIEF DESCRIPTION OF THE DRAWING

The drawing depicts a representative embodiment of a heterojunction inversion-mode metal-insulator-semiconductor field-effect transistor fabricated in accordance with the teachings of this inventive concept.

DESCRIPTION OF THE PREFERRED EMBODIMENT

Referring now to the drawing, a representative heterojunction source-drain insulated gate field-effect transistor 10 is depicted having a semi-insulating InP substrate 11 on which an epitaxial layer 12 of the p-type ternary alloy $Ga_{0.47}In_{0.53}As$ is grown. Its thickness may be of the order of several microns; however, the exact thickness is of no consequence since, instead an acceptor-doped p-type bulk $Ga_{0.47}In_{0.53}As$ might be used.

Photolithographic and etching techniques are used to make shallow troughs in the semi-insulating InP into which n+ doped InP source and drain contacts 13 and 14 are deposited by a chemical vapor-phase transport reaction. This procedure makes symmetrical or asymmetrical n+−p heterojunction contacts at the source and drain electrodes. It is to be noted that an essential feature in this regard is that the ternary alloy epilayer is, in fact, in contact with both the source and drain contacts which are, optionally given a contact metalization layer 13a and 14a to enhance electrical coupling with other circuit components.

In order to prevent deposition of InP on the rest of the $Ga_{0.47}In_{0.53}As$, a silicon dioxide or silicon nitride coating 15 is deposited to a 1.0 micron thickness by a low temperature pyrolysis process. Specific windows 13a' and 14a' are opened in the dielectric coating to form specific windows for the deposition of the source and drain junctions 13 and 14. The windows are opened through the dielectric layer by any of several well known procedures, for example, one employing reactive sputtering or a similar technique.

Optionally, the heterojunctions between the source and drain contacts and the p-type ternary alloy epilayer can be made not only by the epitaxial growth by chemical vapor-phase techniques of n+InP as described above. Having the windows exposed to a stream of phosphine and hydrogen while the $Ga_{0.47}In_{0.53}As$ is heated to approximately 750° C. for about 15 minutes starts a chemical reaction. Since the vapor pressure of phosphorus is considerably greater (by about one order of magnitude) than that of arsenic, a chemical reaction takes place at the surface of the ternary alloy which produces a graded heterojunction in the source and drain contact windows. The composition of the heterojunction may vary from that of InP through the quaternary alloy $In_xGa_{1-x}As_yP_{1-y}$ up to the ternary alloy $Ga_{0.47}In_{0.53}As$. In either case the source and drain heterojunction are reverse biased with respect to the epitaxial layer or the bulk substrate and no current flows between them.

Gate dielectric layer 16, usually silicon dioxide in the order of 0.05 microns to 0.15 microns in thickness, is deposited upon the region between the source and drain contacts. Adequate care is required so that the surface of the $Ga_{0.47}In_{0.53}As$ is not perturbed. That is, its stoichiometry is preserved and its structure and morphology are not altered by the gate dielectric deposition process.

A metal electrode 17, usually aluminum, although other materials may be equally suitable, is used as the gate electrode and is superposed on the gate dielectric layer. The surface of the $Ga_{0.47}In_{0.53}As$ layer under the gate is normally slightly depleted. A positive potential applied to the gate electrode vis-a-vis the ternary alloy attracts electrons to the surface. In other words, the positive potential creates a surface inversion layer on the p-type $Ga_{0.47}In_{0.53}As$ which is isolated from the p-type bulk by an intermediate depletion region. The isolated surface layer produces a conductive channel between the source and drain n+ doped regions and the degree of depletion is a function of the potential applied to the gate. Thus, the gate potential modulates the conductance between the source and drain electrodes producing FET action.

The source and drain heterojunctions optionally are made of other materials which are lattice-matched to $Ga_{0.47}In_{0.53}As$ yet have a larger bandgap. A typical material is the ternary alloy $Al_{0.48}In_{0.52}As$ which has a large bandgap of 1.46 eV and is lattice-matched to InP as well as to $Ga_{0.47}In_{0.53}As$.

The reasons for using an inversion mode transistor based on the ternary alloy rather than some other material are described in detail in the above referenced pending patent application and intend to take full advantage of the specific high electron velocity of the $Ga_{0.47}In_{0.53}As$. Such a device might have power gain at frequencies much higher than presently available devices.

Specifically, the heterojunction source and drain contacts fabricated as described above will have a negligibly small current between the source and drain for large source-drain voltages of the order of 10 volts with a source-to-drain spacing of about four microns and for a gate voltage $V_y=0$. In addition, currents in the order of miliamps for $V_y$ between one volt and ten volts are to be expected and the possibility of optical excitation of either heterojunction and optically-induced modulation of the heterojunction coupled with the transistor action of the I-MISFET also are realizable. High frequency and microwave response due to the high transconductance of the disclosed transistor and the prevention of the minority carrier injection into the larger bandgap InP by the holes in the $Ga_{0.47}In_{0.53}As$ are expected.

Obviously many modifications and variations of the present invention are possible in the light of the above teachings. It is therefore to be understood that within the scope of the appended claims the invention may be practiced otherwise than as specifically described.

What is claimed is:

1. A method of making an inversion mode metal-insulator-semiconductor field-effect transistor having heterojunction source and drain contact junctions comprising:

providing a semi-insulating InP semiconductor substrate;

growing a ternary alloy layer of p-type $Ga_{0.47}In_{0.53}As$ epitaxially on a portion of the semi-insulating InP semiconductor substrate;

coating the exposed semi-insulating semiconductor substrate and the ternary alloy layer with a dielectric;

opening source and drain contact windows through the dielectric coating and in contact with the ternary alloy layer;

exposing the open source and drain contact windows to a stream of phosphine and hydrogen while heating the p-type $Ga_{0.47}In_{0.53}As$ to about 750° C. for about 15 minutes to create a chemical reaction at the surface of the p-type $Ga_{0.47}In_{0.53}As$ producing a graded index heterojunction composed of InP through $In_xGa_{1-x}As_yP_{1-y}$ to $Ga_{0.47}In_{0.53}As$; and superposing a metal gate electrode on the dielectric coated ternary alloy layer in a region lying between the heterojunction source and drain contacts.

2. A method according to claim 1 in which the steps of providing a semi-insulating InP semiconductor substrate and the growing of a ternary alloy layer are eliminated and in place of the layered structure an acceptor-doped p-type bulk $Ga_{0.47}In_{0.53}As$ is utilized.

3. A method according to claim 2 in which the step of opening includes a sputter etching of the dielectric layer.

* * * * *